United States Patent
LoPiccolo et al.

(10) Patent No.: US 9,862,101 B2
(45) Date of Patent: Jan. 9, 2018

(54) SELF-DAMPING END EFFECTOR

(71) Applicant: Varian Semiconductor Equipment Associates, Inc., Gloucester, MA (US)

(72) Inventors: Jack LoPiccolo, Gloucester, MA (US); Paul E. Pergande, Austin, TX (US)

(73) Assignee: Varian Semiconductor Equipment Associats, Inc., Gloucester, MA (US)

( * ) Notice: Subject to any disclaimer, the term of this patent is extended or adjusted under 35 U.S.C. 154(b) by 1 day.

(21) Appl. No.: 14/978,665

(22) Filed: Dec. 22, 2015

(65) Prior Publication Data
US 2017/0173799 A1 Jun. 22, 2017

(51) Int. Cl.
*B25J 15/00* (2006.01)
*B25J 19/00* (2006.01)
*H01L 21/687* (2006.01)

(52) U.S. Cl.
CPC ....... *B25J 15/0014* (2013.01); *B25J 19/0091* (2013.01); *H01L 21/68735* (2013.01); *H01L 21/68785* (2013.01); *H01L 21/68792* (2013.01)

(58) Field of Classification Search
CPC .............. B66F 19/00; H01L 21/67742; H01L 21/68707; H01L 21/68771; H01L 21/68785; H01L 21/68735; H01L 21/68792; B25J 11/0095; B25J 15/0475; B25J 9/042; B25J 9/104; B25J 15/04; B25J 15/0616; B25J 15/0014; B25J 19/0091

USPC .......... 294/213, 902; 414/941, 744.5, 744.6; 74/490.03, 490.04; 901/30, 40
See application file for complete search history.

(56) References Cited

U.S. PATENT DOCUMENTS

| | | | |
|---|---|---|---|
| 7,520,545 B2 * | 4/2009 | Kim .................... | B65G 49/061 294/213 |
| 8,276,959 B2 * | 10/2012 | Kim ....................... | B23Q 7/04 294/183 |
| 9,004,564 B2 * | 4/2015 | Pergande ............. | B25J 15/0014 294/213 |
| 9,061,423 B2 * | 6/2015 | Pergande ............. | B25J 15/0014 |
| 2005/0285419 A1 * | 12/2005 | Matsumoto ....... | H01L 21/67742 294/213 |
| 2013/0005700 A1 | 3/2013 | Takemura et al. | |
| 2013/0213169 A1 * | 8/2013 | Tan ...................... | F16F 7/10 74/490.01 |

FOREIGN PATENT DOCUMENTS

| JP | 4000492 A | 9/1998 |
|---|---|---|
| JP | 2006269951 A | 10/2006 |

OTHER PUBLICATIONS

ISR and Written Opinion dated Mar. 13, 2017 in corresponding international patent application No. PCT/US2016/063843.

* cited by examiner

*Primary Examiner* — Stephen A Vu (57) ABSTRACT

A self-damping end effector including a base, a finger extending from the base and adapted to support a substrate, and a damper associated with the finger, the damper having a natural frequency within a predetermined tolerance of a natural frequency of the finger.

11 Claims, 7 Drawing Sheets

SELF-DAMPING END EFFECTOR

FIELD OF THE DISCLOSURE

Embodiments of the present disclosure relate generally to the field of semiconductor and solar cell processing, and more particularly to end effectors for use in substrate handling systems.

BACKGROUND OF THE DISCLOSURE

Silicon substrates are used in the fabrication of semiconductors and solar cells. During fabrication, substrates are subjected to various manufacturing processes involving numerous machines and process stations. Thus, the substrates need to be transported from one machine/station to another machine/station one or more times.

The transport of the substrates between machines/stations is often performed by robots having support structures, commonly referred to as "end effectors," for supporting and manipulating the substrates in a desired manner. An end effector may be a hand-like or claw-like structure defined by a base with a plurality of fingers or tines extending therefrom. The fingers may be adapted to support a substrate in a horizontal orientation. During operation, the end effector may be moved linearly (e.g., forward and backward) as well as rotationally, all in the same plane (e.g., x-y axis). The end effector may also be moved in a third direction along a z-axis to provide a full range of motion.

When an end effector is moved, the fingers of the end effector may be subjected to significant acceleration forces, causing the fingers to flex and subsequently vibrate according to natural frequencies of the fingers. Such vibration can result in unintended shifting or "walking" of substrates supported by the fingers. This may be highly detrimental to subsequent process steps, especially if a precise arrangement or orientation of the substrates is desired. Vibration can be mitigated by reducing the acceleration of an end effector during movement thereof. Such reductions result in decreased throughput of substrates through a process tool, and are thus generally undesirable.

With respect to these and other considerations the current improvements may be useful.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

An exemplary embodiment of a self-damping end effector in accordance with the present disclosure may include a base, a finger extending from the base and adapted to support a substrate, and a damper associated with the finger, the damper having a natural frequency within a predetermined tolerance of a natural frequency of the finger.

Another exemplary embodiment of a self-damping end effector in accordance with the present disclosure may include a base, a generally planar finger extending from the base and adapted to support a substrate, and a damper comprising a cantilevered portion of the finger defined by a cutout formed in the finger, the damper having a natural frequency within a predetermined tolerance of a natural frequency of the finger.

Another exemplary embodiment of a self-damping end effector in accordance with the present disclosure may include a base, a generally planar finger extending from the base and adapted to support a substrate, and a damper extending from, and contiguous with, an edge of the finger, the damper having a natural frequency within a predetermined tolerance of a natural frequency of the finger.

BRIEF DESCRIPTION OF THE DRAWINGS

By way of example, various embodiments of a device in accordance with the present disclosure will now be described with reference to the accompanying drawings, wherein:

FIG. 1b is a detailed perspective view illustrating a distal end of a finger of the end effector shown in FIG. 1a;

FIG. 1e is a cross sectional perspective view illustrating a finger and a corresponding damper of the end effector shown in FIG. 1a;

DETAILED DESCRIPTION

A self-damping end effector in accordance with the present disclosure will now be described more fully hereinafter with reference to the accompanying drawings, wherein certain exemplary embodiments of the self-damping end effector are presented. The self-damping end effector may be embodied in many different forms and is not to be construed as being limited to the embodiments set forth herein. These embodiments are provided so this disclosure will be thorough and complete, and will fully convey the scope of the self-damping end effector to those skilled in the art. In the drawings, like numbers refer to like elements throughout.

The self-damping end effector described herein may be used in connection with substrate handling equipment such as ion implantation systems, deposition systems, etching systems, lithography systems, vacuum systems, or other systems for processing substrates. The substrates may be solar cells, semiconductor wafers, light-emitting diodes, or other wafers known to those skilled in the art.

Figure 1A:
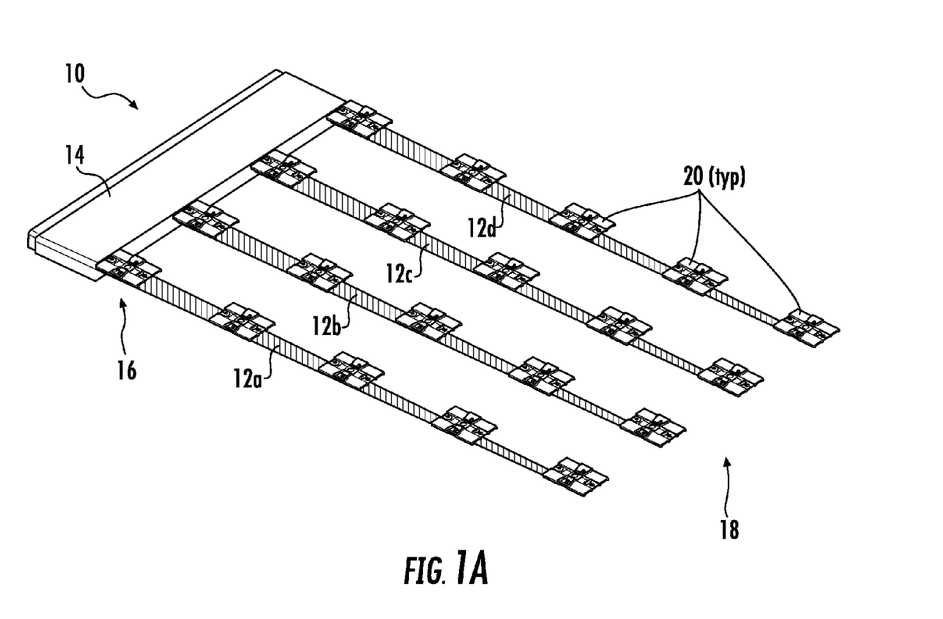
FIG. 1a is a perspective view illustrating an exemplary embodiment of an end effector in accordance with the present disclosure.

FIG. 1a is a top perspective view of an exemplary end effector 10 in accordance with an embodiment of the present disclosure. For the sake of convenience and clarity, terms such as "lateral," "longitudinal," "top," "bottom," "vertical," "horizontal," "height," "width," and "length" will be used herein to describe the relative positions and orientations of various components of the end effector 10, all with respect to the geometry and orientation of the end effector 10 appearing in FIG. 1a. Said terminology will include the words specifically mentioned, derivatives thereof, and words of similar import. Similar terminology will be used in a similar manner to describe subsequent embodiments disclosed herein.

The end effector 10 may include a plurality of parallel, laterally spaced-apart fingers 12a, 12b, 12c, 12d coupled to a base 14. The end effector 10 is shown as having four fingers 12a-12d. Alternatively, the end effector 10 may be provided with more or fewer fingers as may be appropriate to suit a particular application. The fingers 12a-12d may be tubular and may have any of a variety cross-sectional shapes, such as circular, rectangular, hexagonal, etc. The fingers 12a-12d may taper in height and width from a proximal end 16 of the fingers 12a-12d adjacent the base 14 to a distal end 18 located farther away from the base 14.

Figure 1B:
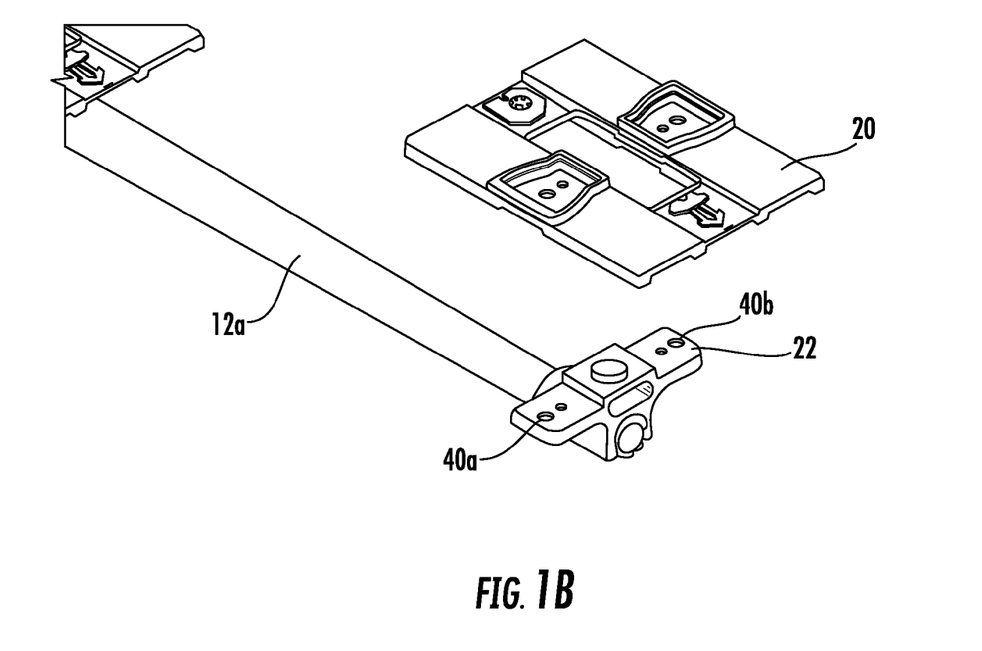

A plurality of support pads 20 may be rigidly affixed to the fingers 12a-12d in a longitudinally spaced-apart relationship. The support pads 20 may be configured to support an array of substrates (not shown) in a manner familiar to those of ordinary skill in the art. Referring to FIG. 1b, a detailed view illustrating an exemplary arrangement for mounting the support pads 20. The support pad 20 may be removably fastened to a saddle 22, such as with mechanical fasteners. The saddle 22 may be affixed to the finger 12a, such as with mechanical fasteners or adhesives. The saddle 22 may thus provide an intermediary mounting structure for removably coupling the support pad 20 to the finger 12a.

Figure 1C:
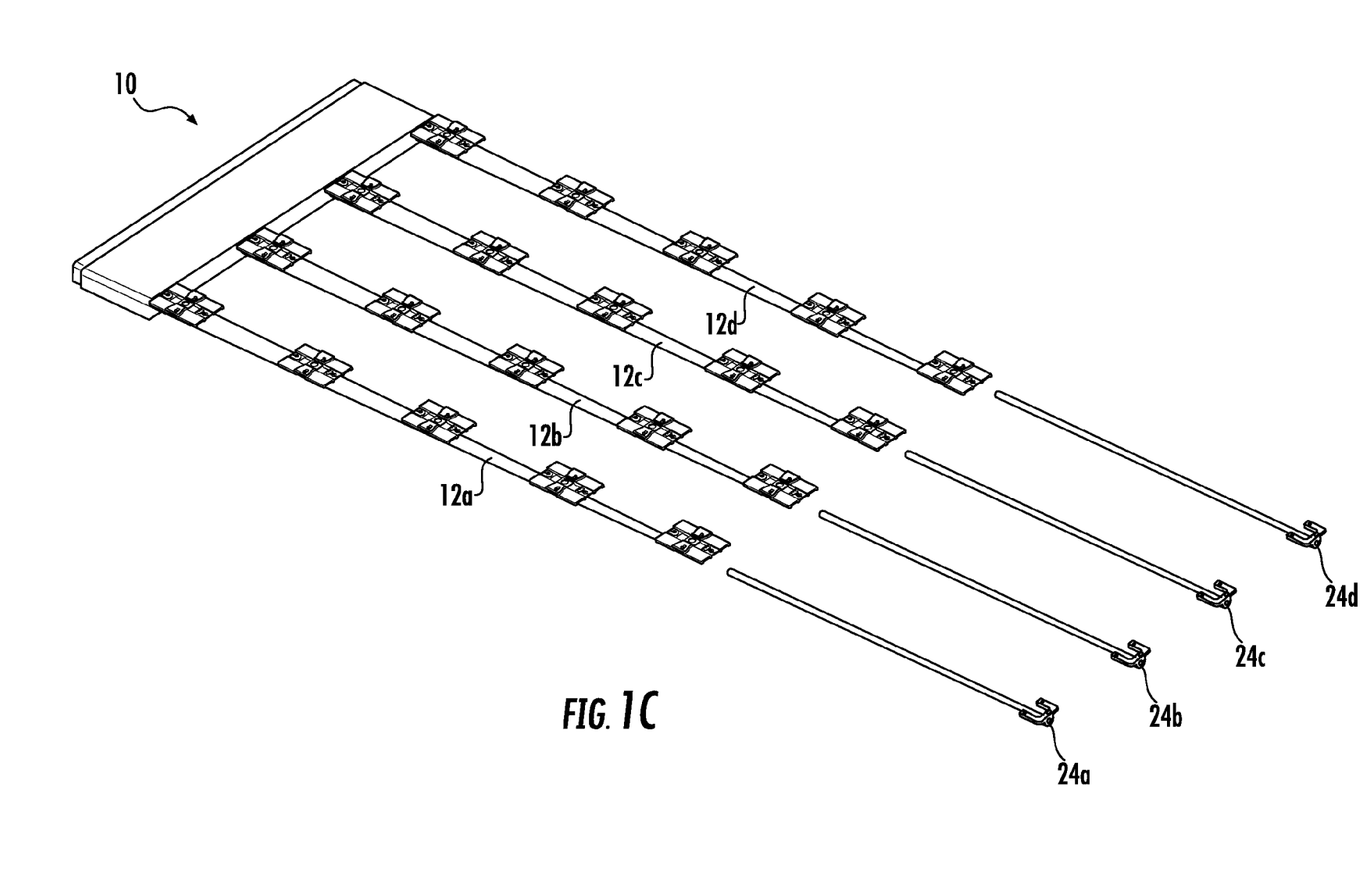
FIG. 1c is a perspective view illustrating the exemplary end effector shown in FIG. 1a with a plurality of dampers for use with the end effector.

Referring to FIG. 1c, the end effector 10 may be provided with a plurality of vibrational dampers 24a, 24b, 24c, 24d (hereinafter "the dampers 24a-24d"). The dampers 24a-24d may be adapted to be inserted longitudinally into, and rigidly coupled to, the fingers 12a-12d. The dampers 24a-24d may be provided for damping vibration of the fingers 12a-12d while avoiding significant increases in the size and weight of the fingers 12a-12d and while avoiding interference with the operation of the fingers 12a-12d as will be described in greater detail below.

Figure 1D:
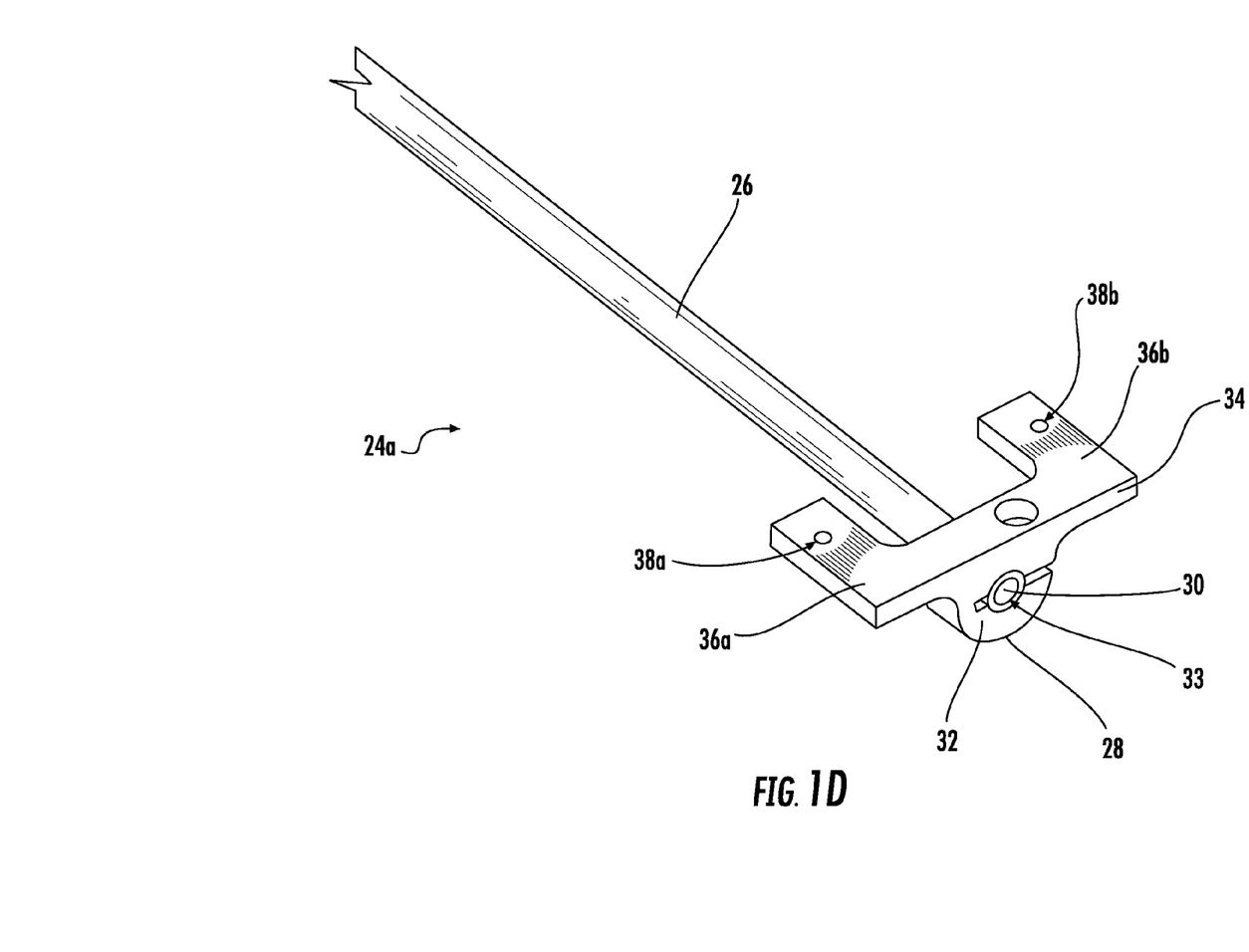
FIG. 1d is a detailed perspective view illustrating one of the dampers shown in FIG. 1c.
Figure 1E:
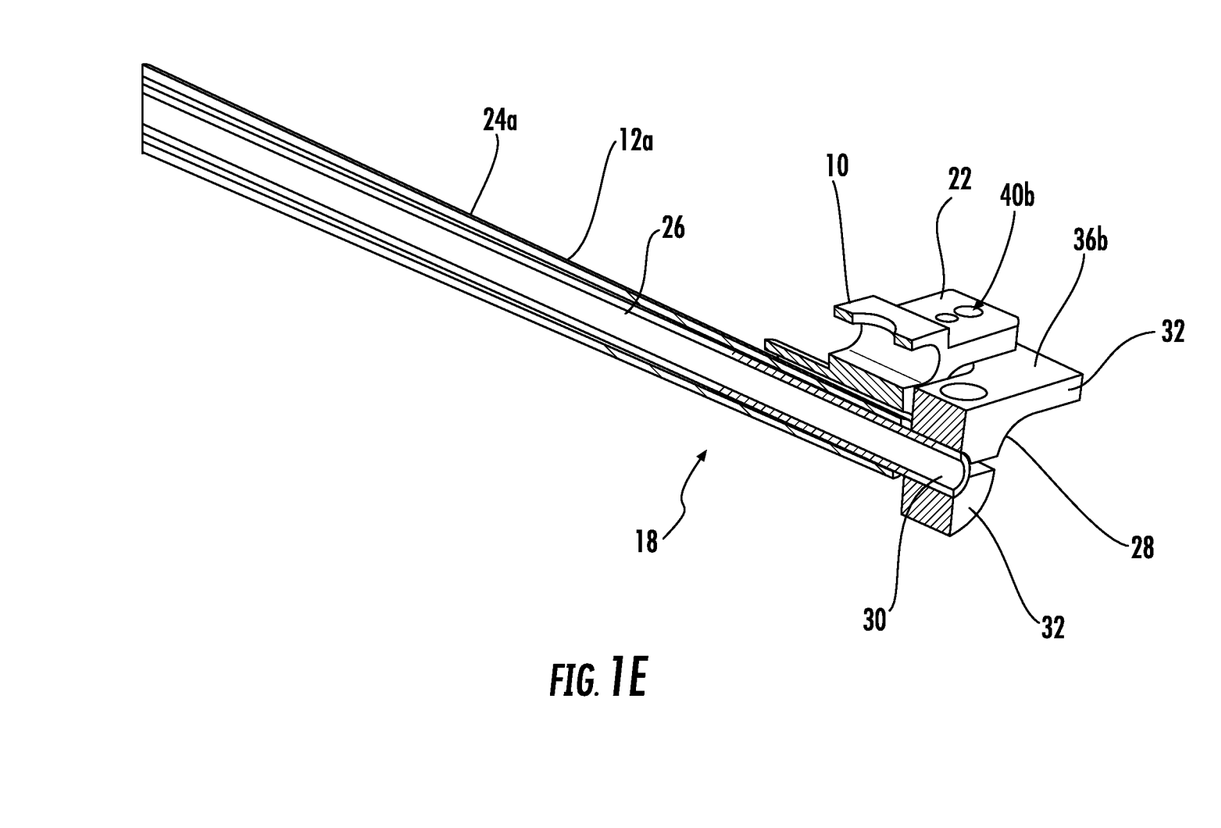

FIGS. 1d and 1e illustrate a detailed view of the damper 24a and a cross-sectional view of the damper 24a and corresponding finger 12a of the end effector 10 (FIG. 1a), respectively. The damper 24a and finger 12a may be identical to the dampers 24b-24d and the fingers 12a-12d shown in FIG. 1c. Thus, the following description of the damper 24a and the finger 12a shall also apply to the dampers 24b-24d and the fingers 12b-12d.

Referring to FIG. 1d, the damper 24a may include an elongated shaft 26 and a mounting bracket 28 coupled to an end 30 of the shaft 26. In various embodiments, the shaft 26 may be tubular or solid. The mounting bracket 28 may be provided with a clamping portion 32 having an aperture 33 for receiving the end 30 of the shaft 26. The clamping portion 32 may be tightened about the end 30 (e.g., by tightening a screw or bolt passing through the clamping portion) to securely couple the mounting bracket 28 to the shaft 26. In other contemplated embodiments, the mounting bracket 28 may be coupled to the shaft 26 using various types of mechanical fasteners and/or adhesives. In other contemplated embodiments, the mounting bracket 28 and the shaft 26 may be formed as integral portions of a contiguous piece of material.

The mounting bracket 28 may include a fastening portion 34 extending from the top of the clamping portion 32 and defining laterally spaced-apart fastening tabs 36a, 36b. The fastening tabs 36a, 36b may be adapted to be removably coupled to a bottom of a saddle 22 (FIG. 1b) at the distal end 18 of a respective finger 12a, such as with mechanical fasteners (not shown) extending through respective pairs of apertures 38a, 38b and 40a, 40b (FIG. 1b) formed in the fastening tabs 36a, 36b and in the saddle 22 (FIG. 1b).

Referring to FIG. 1e, the distal end 18 of the finger 12a is shown with the support pad 20 (FIG. 1a) omitted for clarity. The shaft 26 of the damper 24a may extend into the hollow interior of the finger 12a through the open, distal end 18 of the finger 12a, with the shaft 26 disposed in a generally coaxial relationship with the finger 12a and with the end 30 of the shaft 26 protruding from the distal end 18. The clamping portion 32 of the mounting bracket 28 of the damper 24a may abut the distal end 18 and the finger 12a, and the fastening tab 36b of mounting bracket 28 may extend below, and may be fastened to, the saddle 22 as described above (the fastening tab 36a, while not shown in FIG. 1e, may extend below, and may be fastened to, the saddle 22 in the same manner as the fastening tab 36b). Thus, the damper 24a may be securely fastened to the finger 12a while avoiding significant increases in the outer dimensions or weight of the finger 12a and with the entire damper 24a disposed below the saddle 22 so as not to interfere with substrates supported atop the finger 12a.

A natural frequency of the damper 24a may be dependent upon the stiffness and mass distribution of the damper 24a. The stiffness and the mass distribution of the damper 24a may be configured to provide the damper 24a with a natural frequency equal to, or within a predefined tolerance (e.g., 10%) of, a natural frequency of the finger 12a. With the damper 24a configured thusly, and with the damper 24a rigidly coupled to the finger 12a as described above, the matched (or nearly matched) natural frequencies of the damper 24a and the finger 12a may interfere with one another to provide the aggregate structure (i.e., the coupled damper 24a and finger 12a) with two additional vibrational frequencies, one being below the natural frequencies of the individual damper 24a and individual finger 12a and one being above the natural frequencies of the individual damper 24a and individual finger 12a. The amplitudes of the two additional vibrational frequencies may be smaller than the amplitudes of the natural frequencies of the individual damper 24a and individual finger 12a. Thus, coupling the damper 24a to the finger 12a may significantly reduce the amplitude of vibration of the finger 12a during operation of the end effector 10 (FIG. 1a), mitigating unintended and undesirable shifting of substrates supported by the finger 12a and allowing the end effector 10 to be operated at higher speeds relative to conventional end effectors to improve throughput of a substrate handling system.

In various embodiments, the damper 24a (and, similarly, the dampers 24b-24d) may have configurations, shapes, sizes, and mounting arrangements different than what has been described above, wherein such configurations, shapes, sizes, and mounting arrangements may similarly provide such embodiments with a natural frequency equal to, or within a predefined tolerance of, a natural frequency of the finger 12a. In various embodiments, the finger 12a (and, similarly, the fingers 12b-12d) may be provided with a plurality of dampers distributed along the length of the finger 12a. Such dampers could be coupled to the finger 12a itself, to one or more of the saddles 22 of the finger 12a, and/or to one or more of the support pads 20 of the finger 12a. In various embodiments, such dampers coupled be formed as integral, contiguous features of the finger 12a, saddles 22, and/or support pads 20. Implementing a plurality of dampers on a finger may provide the aggregate structure (i.e., the finger and the plural dampers) with a greater number of vibrational frequencies relative to the "one-damper" embodiment described above, such vibrational frequencies having even smaller amplitudes than those of the one-damper embodiment and thus providing the finger with even greater vibrational damping relative to the one-damper embodiment.

Figure 2:
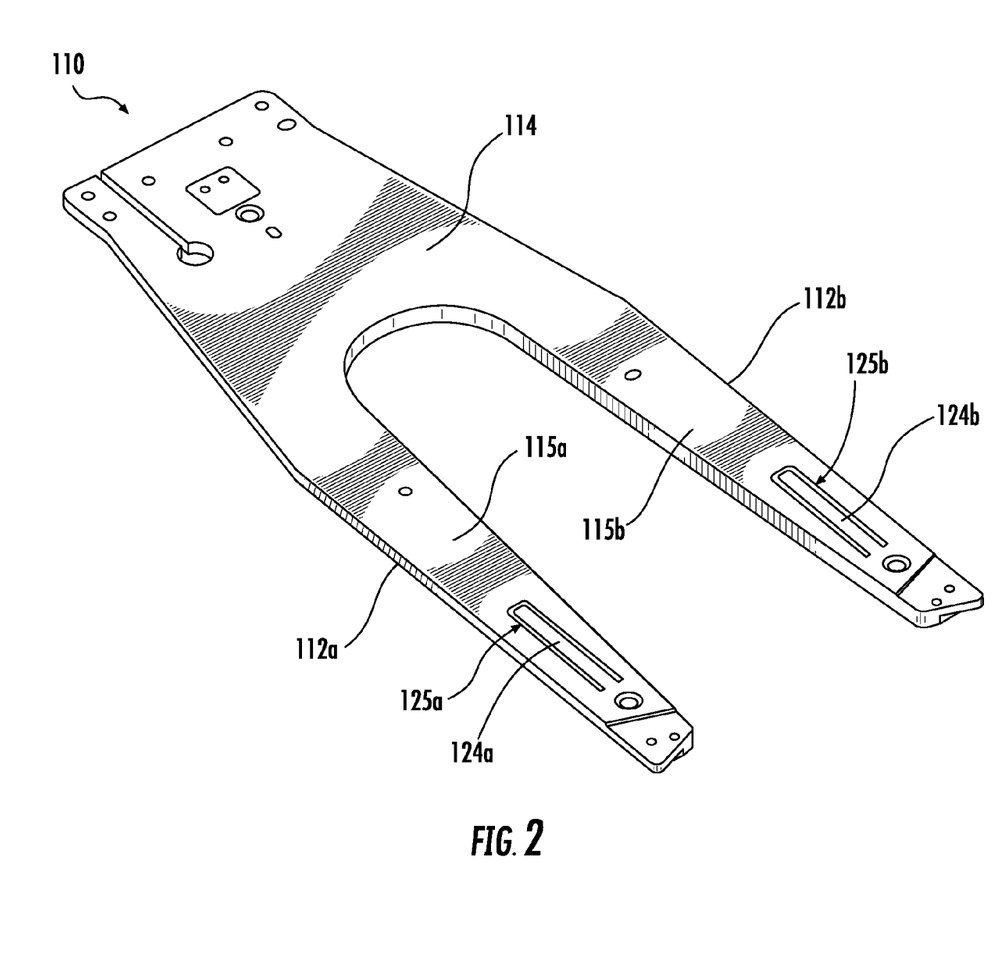
FIG. 2 is a perspective view illustrating another exemplary embodiment of an end effector in accordance with the present disclosure.

FIG. 2 is a top perspective view of exemplary end effector 110 in accordance with another embodiment of the present disclosure. The end effector 110 may be a generally planar structure having two fingers 112a, 112b extending from a base 114. In various embodiments, the end effector 110 may be implemented with a greater or fewer number of fingers than the two fingers 112a, 112b shown in FIG. 2.

The fingers 112a, 112b may be provided with respective cutouts 125a, 125b formed therethrough for defining cantilevered vibrational dampers 124a, 124b (hereinafter "the dampers 124a, 124b") contiguous with, coplanar with, and formed from the same material as, the fingers 112a, 112b. The cutouts 125a, 125b may be generally U-shaped as shown in FIG. 2. In various alternative embodiments, the cutouts 123a, 123b may have virtually any other shape (e.g. a V-shape) similarly defining cantilevered portions of the fingers 112a, 112b.

Similar to the dampers 24a-24d described above, the dampers 124a, 124b may be provided for damping vibration of the fingers 112a, 112b while avoiding significant increases in the size and weight of the fingers 112a, 112b and avoiding interference with the operation of the fingers 112a, 112b. Natural frequencies of the dampers 124a, 124b may be dependent upon the stiffnesses and mass distributions of the dampers 124a, 124b. The stiffnesses and the mass distributions of the dampers 124a, 124b may be configured to provide the dampers 124a, 124b with respective natural frequencies equal to, or within predefined tolerances (e.g., 10%) of, the natural frequencies of their corresponding fingers 112a, 112b. With the dampers 124a, 124b configured thusly, the matched (or nearly matched) natural frequencies of the dampers 124a, 124b and their corresponding fingers 112a, 112b may interfere with one another to provide the aggregate structures (i.e., the aggregate structure of the damper 124a and finger 112a and the aggregate structure of the damper 124b and finger 112b) with two additional vibrational frequencies, one being below the natural frequencies of the respective individual dampers 124a, 124b and respective individual fingers 112a, 112b and one being above the natural frequencies of the respective individual dampers 124a and respective individual fingers 112a, 112b. The amplitudes of the two additional vibrational frequencies are smaller than the amplitudes of the natural frequencies of the respective individual dampers 124a, 124b and respective individual fingers 112a, 112b. Thus, providing the fingers 112a, 112b with the dampers 124a, 124b may significantly reduce the amplitudes of vibration of the fingers 112a, 112b during operation of the end effector 110, mitigating unintended and undesirable shifting of substrates supported by the fingers 112a, 112b and allowing the end effector 110 to be operated at higher speeds relative to conventional end effectors to improve throughput of a substrate handling system.

In various embodiments, the dampers 124a, 124b may have configurations, shapes, sizes, and arrangements different than what has been described above, wherein such configurations, shapes, sizes, and arrangements may similarly provide such embodiments with natural frequencies equal to, or within predefined tolerances of, the natural frequencies of the corresponding fingers 112a, 112b. In various embodiments, the fingers 112a, 112b may be provided with respective pluralities of dampers (defined by respective cutouts) similar to the dampers 124a, 124b distributed along the lengths of the fingers 112a, 112b. Implementing a plurality of dampers on a finger may provide the aggregate structure (i.e., the finger and the plural dampers) with a greater number of vibrational frequencies relative to the "one-damper" embodiment described above, such vibrational frequencies having even smaller amplitudes than those of the one-damper embodiment and thus providing the finger with even greater vibrational damping relative to the one-damper embodiment.

Figure 3:
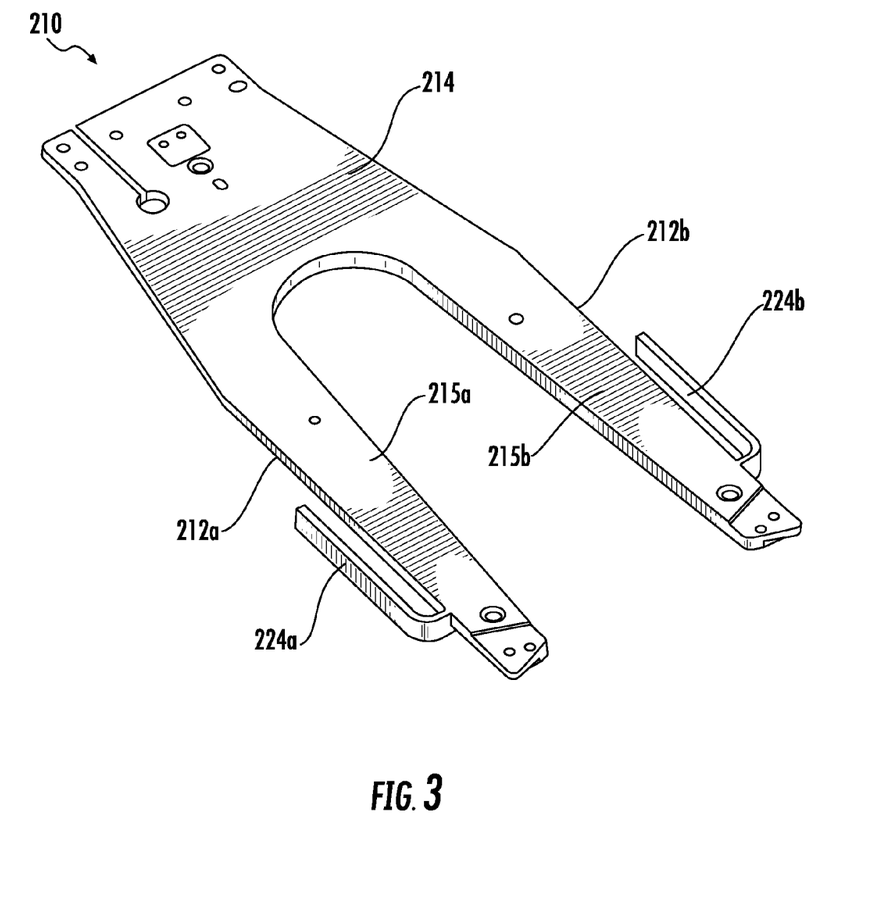
FIG. 3 is a perspective view illustrating another exemplary embodiment of an end effector in accordance with the present disclosure.

FIG. 3 is a top perspective view of exemplary end effector 210 in accordance with another embodiment of the present disclosure. The end effector 210 may be a generally planar structure having two fingers 212a, 212b extending from a base 214. In various embodiments, the end effector 210 may be implemented with a greater or fewer number of fingers than the two fingers 212a, 212b shown in FIG. 3.

The fingers 212a, 212b may be provided with respective vibrational dampers 224a, 224b (hereinafter "the dampers 224a, 224b") formed as integral, contiguous extensions of the fingers 212a, 212b. In the illustrated embodiment, the dampers 224a, 224b extend from the outer edges of the fingers 212a, 212b. In various other embodiments, the dampers 224a, 224b may extend from the inner edges, tips, or undersides of the fingers 212a, 212b. In various embodiments, the dampers 224a, 224b may be formed from the same material as the fingers 212a, 212b.

The dampers 224a, 224b may be generally L-shaped as shown in FIG. 3. In various alternative embodiments, the dampers 224a, 224b may have virtually any shape, such as a Z-shape, a U-shape, a W-shape, a circular shape, a rectangular shape, a triangular shape, an irregular shape, etc. Similar to the dampers 24a-24d and 124a, 124b described above, the dampers 224a, 224b may be provided for damping vibration of the fingers 212a, 212b while avoiding significant increases in the size and weight of the fingers 212a, 212b and avoiding interference with the operation of the fingers 212a, 212b as will be described in greater detail below.

Natural frequencies of the dampers 224a, 224b may be dependent upon the stiffnesses and mass distributions of the dampers 224a, 224b. The stiffnesses and the mass distributions of the dampers 224a, 224b may be configured to provide the dampers 224a, 224b with respective natural frequencies equal to, or within predefined tolerances (e.g., 10%) of, the natural frequencies of their corresponding fingers 212a, 212b. With the dampers 224a, 224b configured thusly, and with the dampers 224a, 224b rigidly coupled to the fingers 212a, 212b as described above, the matched (or nearly matched) natural frequencies of the dampers 224a, 224b and their corresponding fingers 212a, 212b may interfere with one another to provide the aggregate structures (i.e., the coupled damper 224a and finger 212a and the coupled damper 224b and finger 212b) with two additional vibrational frequencies, one being below the natural frequencies of the respective individual dampers 224a, 224b and respective individual fingers 212a, 212b and one being above the natural frequencies of the respective individual dampers 224a and respective individual fingers 212a, 212b. The amplitudes of the two additional vibrational frequencies are smaller than the amplitudes of the natural frequencies of the respective individual dampers 224a, 224b and respective individual fingers 212a, 212b. Thus, coupling the dampers 224a, 224b to the fingers 212a, 212b may significantly reduce the amplitudes of vibration of the fingers 212a, 212b during operation of the end effector 210, mitigating unintended and undesirable shifting of substrates supported by the fingers 212a, 212b and allowing the end effector 210 to be operated at higher speeds relative to conventional end effectors to improve throughput of a substrate handling system.

In various embodiments, the dampers 224a, 224b may have configurations, shapes, sizes, and mounting arrangements different than what has been described above, wherein such configurations, shapes, sizes, and mounting arrangements may similarly provide such embodiments with natural frequencies equal to, or within predefined tolerances of, the natural frequencies of the corresponding fingers 212a, 212b. In various embodiments, the fingers 212a, 212b may be provided with respective pluralities of dampers similar to the dampers 224a, 224b distributed along the lengths of the fingers 212a, 212b. Implementing a plurality of dampers on a finger may provide the aggregate structure (i.e., the finger and the plural dampers) with a greater number of vibrational frequencies relative to the "one-damper" embodiment described above, such vibrational frequencies having even smaller amplitudes than those of the one-damper embodiment and thus providing the finger with even greater vibrational damping relative to the one-damper embodiment.

In view of the foregoing description, those of ordinary skill in the art will appreciate numerous advantages provided by the end effectors 10, 110, 210 and dampers 24a-24d, 124a, 124b, and 224a, 224b of the present disclosure relative to conventional end effectors. For example, a first advantage conferred by the end effectors 10, 110, 210 and dampers 24a-24d, 124a, 124b, and 224a, 224b is reduced vibrational amplitude, resulting in a mitigation of unintended and undesirable shifting of substrates supported by the end effectors 10, 110, 210. Another advantage conferred by the end effectors 10, 110, 210 and dampers 24a-24d, 124a, 124b, and 224a, 224b is the ability to move the end effectors 10, 110, 210 with greater speed and with greater acceleration relative to conventional end effectors while mitigating unintended shifting of substrates supported by the end effectors 10, 110, 210. Yet another advantage conferred by the end effectors 10, 110, 210 and dampers 24a-24d, 124a, 124b, and 224a, 224b is the ability to implement the above-described vibration damping features while mitigating interference with the substrate-handling capabilities of the end effectors 10, 110, 210 and while avoiding significant increases in the size or weight of the end effectors 10, 110, 210 relative to conventional end effectors.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize its usefulness is not limited thereto and the present disclosure may be beneficially implemented in any number of environments for any number of purposes. Accordingly, the claims set forth below are to be construed in view of the full breadth and spirit of the present disclosure as described herein.

The invention claimed is:

1. A self-damping end effector comprising:
   a base;
   a plurality of fingers extending from the base and adapted to support a substrate; and
   a damper associated with one of plurality of fingers, the damper having a natural frequency within a predetermined tolerance of a natural frequency of the one of the plurality of fingers;
   wherein the damper comprises an elongated shaft extending into a hollow interior of the one of the plurality of fingers.

2. The self-damping end effector of claim 1, further comprising a saddle coupled to the one of the plurality of fingers for facilitating coupling of a support pad to the one of the plurality of fingers, the damper further comprising a mounting bracket coupled to an end of the shaft protruding from an end of the one of the plurality of fingers, the mounting bracket coupled to the saddle.

3. The self-damping end effector of claim 1, wherein the predetermined tolerance is 10%.

4. The self-damping end effector of claim 1, wherein the damper comprises a plurality of dampers, each of the plurality of dampers rigidly coupled to a respective one of the plurality of fingers and comprising an elongated shaft extending into a hollow interior of the respective one of the plurality of fingers.

5. A self-damping end effector comprising:
   a base;
   first and second generally planar fingers extending from the base and adapted to support a substrate;
   a first damper comprising a cantilevered portion of the first finger defined by a cutout formed in the first finger, the first damper having a natural frequency within a predetermined tolerance of a natural frequency of the first finger;
   a second damper comprising a cantilevered portion of the second finger defined by a cutout formed in the second finger, the second damper having a natural frequency within a predetermined tolerance of a natural frequency of the second finger.

6. The self-damping end effector of claim 5, wherein the predetermined tolerance associated with the first damper is 10%.

7. The self-damping end effector of claim 5, wherein the first damper comprises a plurality of cantilevered portions of the first finger defined by respective cutouts formed in the first finger.

8. The self-damping end effector of claim 5, wherein the cutout in the first finger is U-shaped.

9. A self-damping end effector comprising:
   a base;
   a generally planar finger extending from the base and adapted to support a substrate; and
   a damper extending from, and contiguous with, an edge of the finger, the damper having a natural frequency within a predetermined tolerance of a natural frequency of the finger;
   wherein the finger comprises a first finger and a second finger and the damper comprises a first damper and a second damper, the first damper comprising a contiguous extension of the edge of the first finger and the second damper comprising a contiguous extension of the edge of the second finger.

10. The self-damping end effector of claim 9, wherein the predetermined tolerance is 10%.

11. The self-damping end effector of claim 9, wherein the damper is L-shaped.

* * * * *